United States Patent
Kinoshita et al.

(10) Patent No.: US 12,063,746 B2
(45) Date of Patent: Aug. 13, 2024

(54) COMPONENT MOUNTING SYSTEM

(71) Applicant: FUJI CORPORATION, Chiryu (JP)

(72) Inventors: Kazuya Kinoshita, Toki (JP); Kohei Ishikawa, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 339 days.

(21) Appl. No.: 17/642,854

(22) PCT Filed: Sep. 26, 2019

(86) PCT No.: PCT/JP2019/038000
§ 371 (c)(1),
(2) Date: Mar. 14, 2022

(87) PCT Pub. No.: WO2021/059457
PCT Pub. Date: Apr. 1, 2021

(65) Prior Publication Data
US 2022/0394895 A1    Dec. 8, 2022

(51) Int. Cl.
*H05K 13/08* (2006.01)
*B65G 1/137* (2006.01)

(52) U.S. Cl.
CPC ......... *H05K 13/086* (2018.08); *B65G 1/1371* (2013.01)

(58) Field of Classification Search
CPC ............. H05K 13/0417; H05K 13/085; H05K 13/021; H05K 13/086; B65G 1/1371
USPC ...................................................... 414/273
See application file for complete search history.

(56) References Cited

U.S. PATENT DOCUMENTS

| | | | | |
|---|---|---|---|---|
| 2016/0353624 A1* | 12/2016 | Maezono | ............... | H05K 13/08 |
| 2017/0354070 A1* | 12/2017 | Kobayashi | ........... | H05K 13/086 |
| 2018/0242485 A1* | 8/2018 | Kondo | ............... | H05K 13/0473 |

FOREIGN PATENT DOCUMENTS

WO    WO 2018/087854 A1    5/2018

OTHER PUBLICATIONS

International Search Report mailed on Nov. 5, 2019 in PCT/JP2019/038000 filed on Sep. 26, 2019 (1 page).

\* cited by examiner

*Primary Examiner* — Glenn F Myers
(74) *Attorney, Agent, or Firm* — Oblon, McClelland, Maier & Neustadt, L.L.P.

(57) ABSTRACT

A component mounting system includes a component mounter group, a storage, and a loader. The storage is provided on an upstream side or a downstream side of the component mounter group and has a storage area in which multiple component supply devices are arranged and supported detachably. The loader automatically takes out and/or attach the component supply devices from and/or to the component mounters and the storage. When an occupancy state of the component supply device supported by the storage area reaches a predetermined high occupancy state, the control section of the component mounting system outputs at least one of a recovery urging warning for prompting recovery of the component supply devices supported by the storage area and a replenishment prohibition warning for prohibiting replenishment of the component supply device used in a next production or later onto the storage area.

5 Claims, 5 Drawing Sheets

COMPONENT MOUNTING SYSTEM

TECHNICAL FIELD

The present specification discloses a component mounting system.

BACKGROUND ART

Conventionally, there has been known a component mounting system in which a storage is provided on an upstream side of a component mounter group having multiple component mounters arranged along a conveyance direction of a substrate, and a loader automatically takes out and/or attaches a feeder from and/or to the component mounters and the storage (refer to Patent Literature 1).

PATENT LITERATURE

Patent Literature 1: International Publication No. WO2018/087854

BRIEF SUMMARY

Technical Problem

However, in Patent Literature 1, for example, when a storage is occupied by a feeder with no components and is in a state where there is no space, a loader cannot be recovered when the feeder with no components is generated in the component mounter thereafter, which may cause a situation in which a production line stops. The same applies to a case where a feeder required for future production is blindly stored in the storage so that the storage is placed in a state where there is no space.

The present disclosure is made in consideration of the problems, and a main object of the present disclosure is to prevent a storage from becoming in a state where there is no space in advance.

Solution to Problem

According to the present disclosure, there is provided a component mounting system including: a component mounter group in which multiple component mounters in which multiple component supply devices are detachably set and configured to mount a component supplied by the component supply device on a mounting target are arranged along a conveyance direction of the mounting target; a storage provided on an upstream side or a downstream side of the component mounter group and having a storage area in which the multiple component supply devices are arranged and supported detachably; a loader configured to move along the conveyance direction and automatically take out and/or attach the component supply devices from and to the component mounter and the storage; and a control section configured to output at least one of a recovery urging warning for prompting recovery of the component supply devices supported by the storage area and a replenishment prohibition warning for prohibiting replenishment of the component supply device used in a next production or later onto the storage area, when an occupancy state of the component supply devices supported by the storage area reaches a predetermined high occupancy state.

In this component mounting system, when the occupancy state of the component supply device supported by the storage area reaches the predetermined high occupancy state, at least one of the recovery urging warning for prompting the recovery of the component supply device supported by the storage area and the replenishment prohibition warning for prohibiting replenishment of the component supply device used in the next production or later onto the storage area is output. When the component supply device supported by the storage area is recovered according to the recovery urging warning, since the occupancy state of the storage area is alleviated, after that, even when the component supply device to be stored from the component mounter to the storage is generated, it is possible to receive the component supply device. In addition, when the replenishment of the component supply device on the storage area is prohibited according to the replenishment prohibition warning, since a degree of vacancy in the storage area can be maintained to a certain extent, after that, even when the component supply device to be stored from the component mounter to the storage is generated, it is possible to receive the component supply device. Accordingly, it is possible to prevent the storage from becoming a state where there is no space.

DESCRIPTION OF EMBODIMENTS

Figure 1:
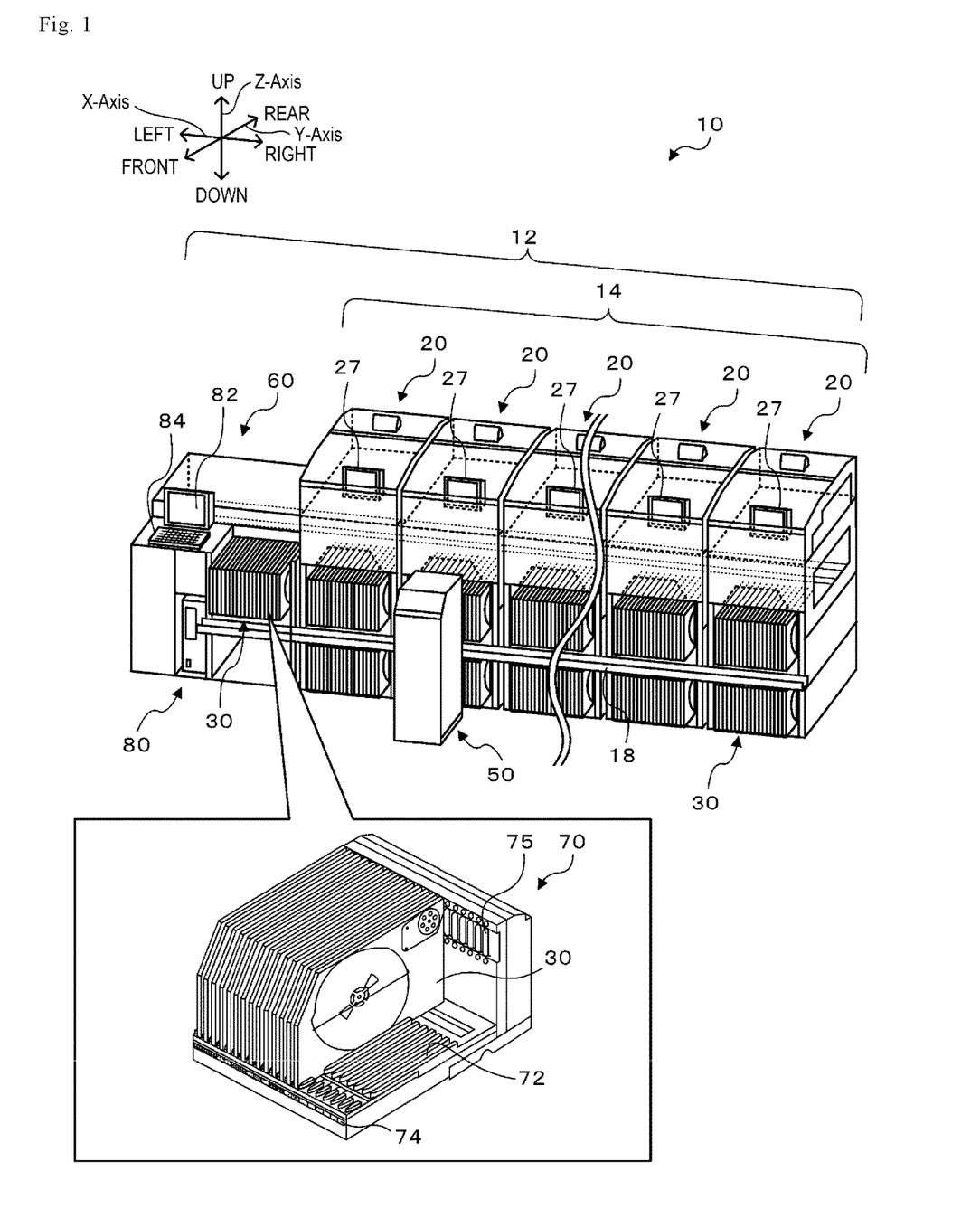
FIG. 1 is a perspective view schematically illustrating component mounting system 10.
Figure 2:
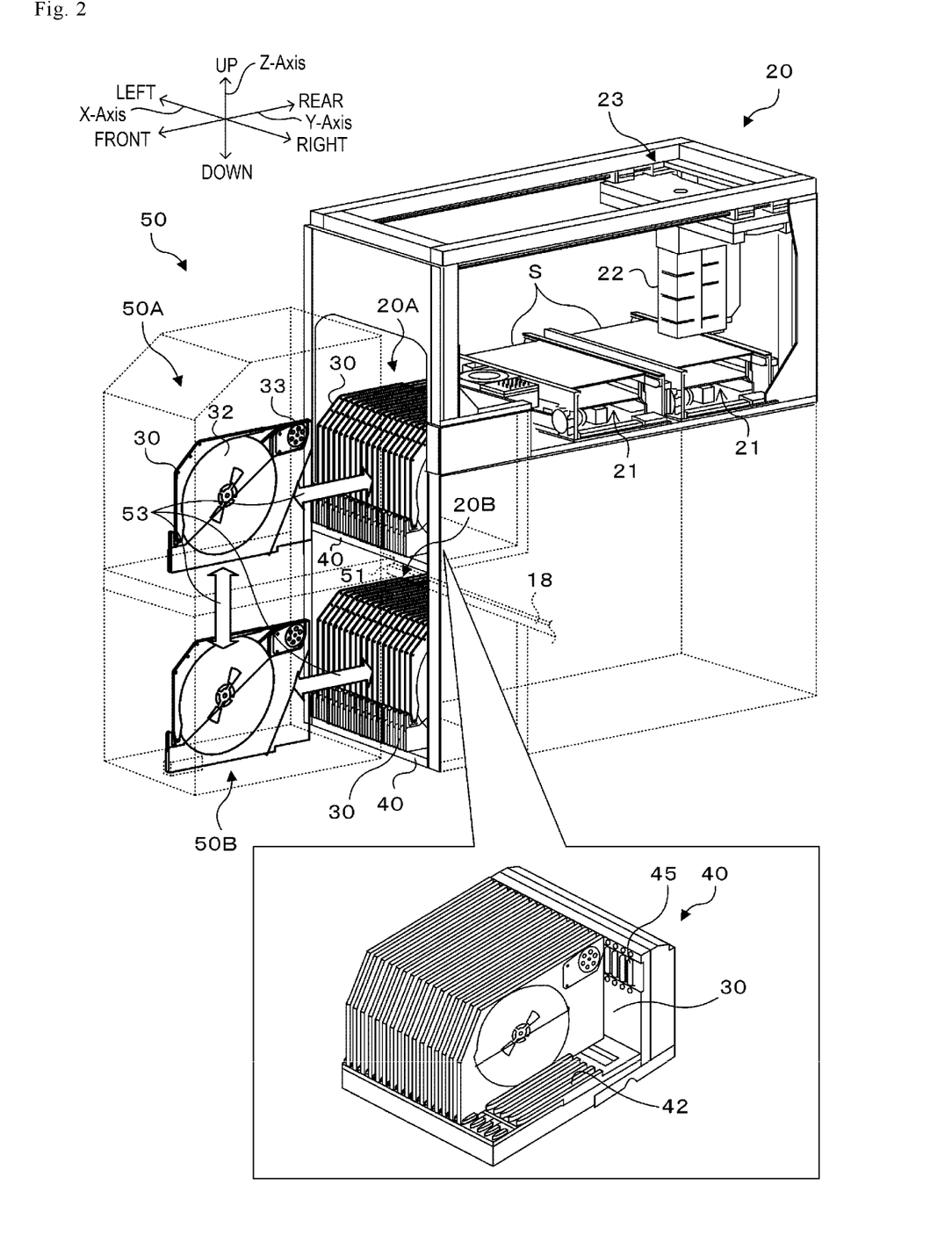
FIG. 2 is a perspective view schematically illustrating component mounter 20.
Figure 3:
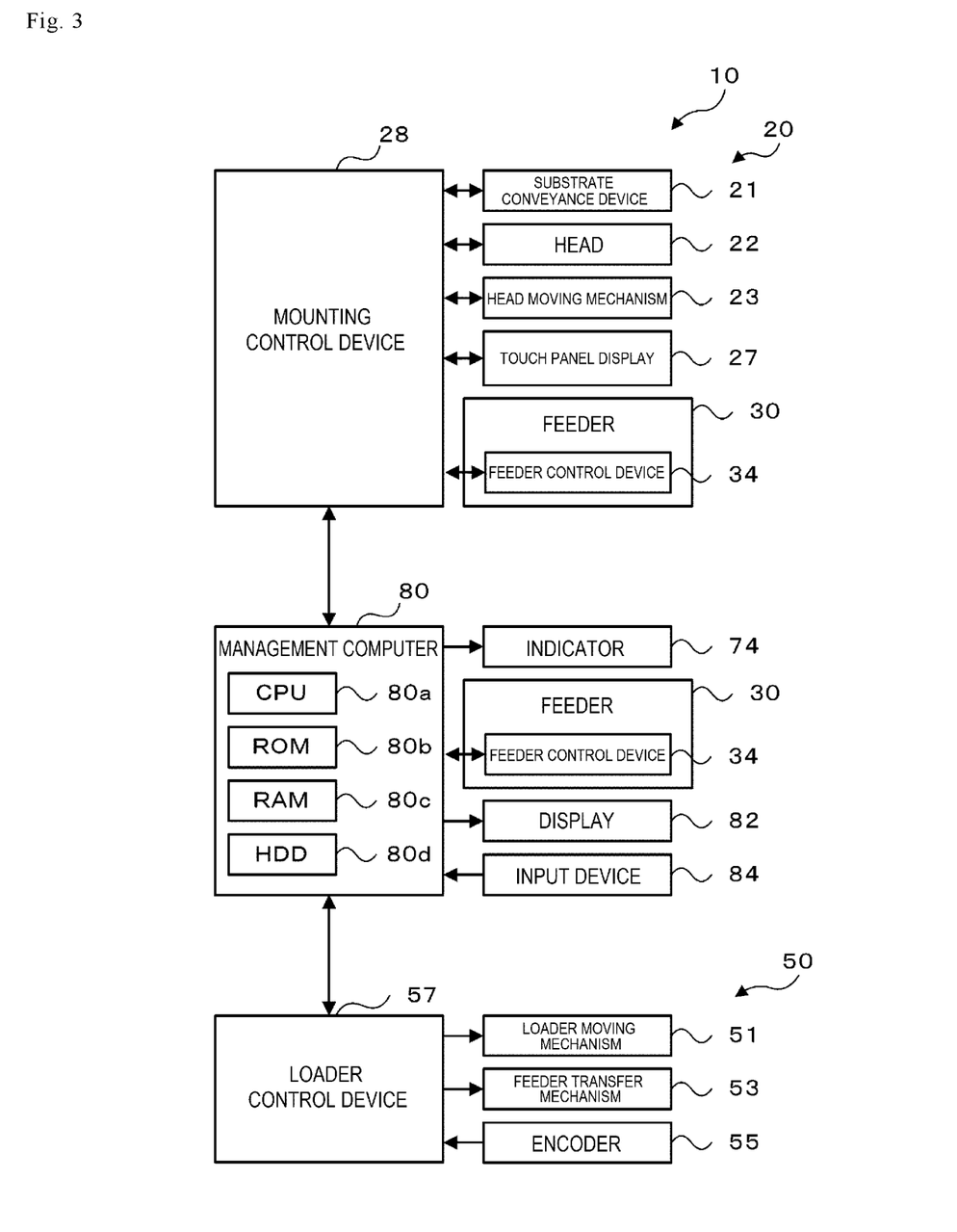
FIG. 3 is a block diagram illustrating a configuration related to a control of component mounting system 10.

Next, embodiments for implementing a component mounting system of the present disclosure will be described with reference to the accompanying drawings. FIG. 1 is a perspective view schematically illustrating component mounting system 10 according to the present embodiment, FIG. 2 is a perspective view schematically illustrating component mounter 20, and FIG. 3 is a block diagram illustrating a configuration for controlling component mounting system 10. In FIG. 1, a right-left direction is an X-direction, a front-rear direction is a Y-direction, and an up-down direction is a Z-direction.

As illustrated in FIG. 1, component mounting system 10 includes component mounting line 12, loader 50, and management computer 80. In component mounting line 12, component mounter group 14 and feeder storage 60 are arranged in the X-direction. In component mounter group 14, multiple component mounters 20 are arranged in the X-direction. Component mounter 20 mounts a component supplied from feeder 30 (corresponding to a component supply device) on substrate S (corresponding to a mounting target, refer to FIG. 2). Substrate S is conveyed from a left side (an upstream side) to a right side (a downstream side) of component mounting line 12 along the X-direction. Feeder storage 60 is disposed on an upstream side of component mounter group 14. Loader 50 can automatically exchange feeder 30 between component mounter 20 and loader 50 or feeder storage 60 and loader 50. Management computer 80 manages the entire system.

As illustrated in FIG. 2, component mounter 20 includes substrate conveyance device 21 for conveying substrate S in the X-direction, head 22 having a nozzle for picking up a component supplied by feeder 30, head moving mechanism 23 for moving head 22 in the XY-directions, and touch panel display 27 (refer to FIG. 1). In addition, component mounter 20 includes mounting control device 28 (refer to FIG. 3) including known center processing unit (CPU), read only memory (ROM), random access memory (RAM), and the like. Mounting control device 28 controls entire component mounter 20. Mounting control device 28 can input and output a signal to and from substrate conveyance device 21, head 22, head moving mechanism 23, touch panel display 27, and the like. In addition, component mounter 20 has two upper and lower areas to which feeders 30 can be attached at a front part thereof. The upper area is supply area 20A to which feeder 30 can supply the component, and the lower area is stock area 20B in which feeder 30 can be stocked. Feeder base 40 formed in an L-shape in a side view, is provided in supply area 20A and stock area 20B. Multiple feeders 30 are detachably attached to each feeder base 40.

As illustrated in FIG. 2, feeder 30 is configured as a tape feeder that feeds a tape accommodating components at a predetermined pitch. Feeder 30 includes tape reel 32 around which a tape is wound, tape feeding mechanism 33 that feeds the tape from tape reel 32, and feeder control device 34 (refer to FIG. 3). In addition, as illustrated in FIG. 2, feeder base 40 includes multiple slots 42 arranged in the X-direction at intervals at which feeder 30 can be inserted individually. Slot 42 detachably supports feeder 30. When feeder 30 is inserted into slot 42 of feeder base 40, a connector (not illustrated) of feeder 30 is connected to connector 45 of feeder base 40. As a result, feeder control device 34 can communicate with a control section (mounting control device 28, management computer 80, and the like) to which feeder 30 is attached. Feeder control device 34 feeds the component accommodated in the tape to a predetermined component supplying position by tape feeding mechanism 33, and when the component at the component supplying position is picked up by the nozzle of head 22, feeder control device 34 feeds the component accommodated in the tape to a predetermined component supplying position again by tape feeding mechanism 33.

As illustrated in FIG. 1, loader 50 can move along X-axis rail 18 provided parallel to the conveyance direction (X-direction) of the substrate on front surfaces of multiple component mounters 20 and a front surface of feed storage 60, and thus, loader 50 automatically takes out and/or attaches feeder 30 from and/or to component mounters 20 and feeder storage 60. As illustrated in FIGS. 2 and 3, loader 50 includes loader moving mechanism 51 and feeder transfer mechanism 53. Loader moving mechanism 51 moves loader 50 along X-axis rail 18. Feeder transfer mechanism 53 is configured to attach feeder 30 to component mounter 20 or feeder storage 60 from loader 50, detach feeder 30 from component mounter 20 or feeder storage 60 to accommodate feeder 30 in loader 50, and move feeder 30 between upper transfer area 50A and lower transfer area 50B. In addition, as illustrated in FIG. 3, loader 50 also includes encoder 55 and loader control device 57. Encoder 55 detects a movement position of loader 50 in the X-direction. Loader control device 57 is configured by known CPU, ROM, RAM, and the like. Loader control device 57 receives a detection signal input from encoder 55 and outputs a drive signal to loader moving mechanism 51 and feeder transfer mechanism 53.

Feeder storage 60 has feeder base 70 (corresponding to a storage area and refer to FIG. 1) having substantially the same configuration as that of feeder base 40 provided in component mounter 20 in order to accommodate multiple feeders 30. Feeder base 70 includes multiple slots 72 arranged in the X-direction at intervals at which feeder 30 can be inserted individually. Slot 72 detachably supports feeder 30. When feeder 30 is inserted into slot 72 of feeder base 70, a connector (not illustrated) of feeder 30 is connected to connector 75 of feeder base 70. As a result, feeder control device 34 can communicate with a control section (mounting control device 28, management computer 80, and the like) to which feeder 30 is attached. Examples of feeder 30 stored in feeder base 70 include feeder 30 with no components, feeder 30 which is not scheduled to be used in a current production plan, feeder 30 which is scheduled to be used in a current production plan, or the like. Indicator 74 (display) including an LED is provided on a front surface of feeder base 70 at a position corresponding to each slot 72.

Management computer 80 controls component mounting line 12, and includes well-known CPU 80a (corresponding to a control section), ROM 80b, RAM 80c, HDD 80d, and the like, as illustrated in FIG. 3, and is connected to display 82 such as an LCD, input device 84 such as a keyboard and a mouse, and the like. HDD 80d of management computer 80 stores a production program (a program related to a production plan that determines what components to be mounted on substrate S, how many substrates S on which the components are mounted are manufactured, and the like), a production job (a job that determines which feeder 30 is set on feeder base 40 in what order and what component types to be mounted on substrate S in what order for each component mounter 20), and the like. The production program is stored in HDD 80d of management computer 80 by a worker operating input device 84. The production job is set based on the production program by CPU 80a of management computer 80 and is stored in HDD 80d. In setting the production job, management computer 80 sets a mounting sequence based on the production program, distributes the mounting sequence to each component mounter 20, sets a mounting order of components distributed to each component mounter 20, sets how to arrange feeders 30 for each component mounter 20, and sets the production jobs for all those component mounters 20 so that the production efficiency of component mounting line 12 is increased as high as possible. As a result, when production programs are switched, production jobs for each component mounter 20 are also switched. Management computer 80 is connected to mounting control device 28 and loader control device 57 so as to enable a bidirectional communication therebetween. Management computer 80 receives information on a mounting status of component mounter 20 from mounting control device 28 and receives information on a driving status of loader 50 from loader control device 57. Management computer 80 is communicably connected to feeder control device 34 of feeder 30 inserted into slots 42 and 72 of feeder bases 40 and 70, and thus, can acquire information on feeder 30.

Next, an operation (a component mounting operation) will be described in which mounting control device 28 of component mounter 20 mounts the component on substrate S based on the production job received from management computer 80. First, mounting control device 28 causes the nozzle of head 22 to pick up a component supplied from feeder 30. Specifically, mounting control device 28 controls head moving mechanism 23 so that head moving mechanism 23 moves the nozzle of head 22 to a position situated directly above a component supplying position of a desired component. Next, mounting control device 28 lowers the nozzle to supply a negative pressure to the nozzle. As a result, the desired component is picked up to a distal end of the nozzle. Thereafter, mounting control device 28 raises the nozzle and controls head moving mechanism 23 so that the nozzle which has picked up the component moves to a position situated above a predetermined position on substrate S. Then, in the predetermined position, mounting control device 28 lowers the nozzle and supplies the atmospheric pressure to the nozzle. As a result, the component picked up to the nozzle is separated from the nozzle and mounted at the predetermined position on substrate S. Other components to be mounted on substrate S are also mounted on substrate S in a similar manner, and when the mounting of all the components is completed, substrate S is fed to component mounter 20 on the downstream side.

Next, an operation will be described which is performed when loader control device 57 causes loader 50 to execute an automatic exchange of feeders 30 based on an instruction from management computer 80. When loader control device 57 receives an instruction from management computer 80 to transfer unnecessary feeder 30 (for example, feeder 30 with no components or feeder 30 not to be used in the next production) to feeder storage 60, loader control device 57 controls loader moving mechanism 51 so that loader moving mechanism 51 moves to a position ahead of feeder base 40 of component mounter 20 to which unnecessary feeder 30 is attached. Subsequently, loader control device 57 controls feeder transfer mechanism 53 so that feeder transfer mechanism 53 detaches unnecessary feeder 30 from feeder base 40 and accommodates feeder 30 in loader 50, and controls loader moving mechanism 51 so that loader moving mechanism 51 moves to a position ahead of feeder base 70 of feeder storage 60. Subsequently, loader control device 57 controls feeder transfer mechanism 53 so that feeder 30 is attached to the empty slot of feeder base 70. In addition, when loader control device 57 receives an instruction from management computer 80 to replenish necessary feeder 30 (for example, feeder 30 in place of feeder 30 with no components or feeder 30 to be used in the next production), loader control device 57 controls loader moving mechanism 51 so that loader moving mechanism 51 moves to the position ahead of feeder base 70 of feeder storage 60. Subsequently, loader control device 57 controls feeder transfer mechanism 53 so that feeder transfer mechanisms 53 detaches necessary feeder 30 stored in feeder base 70 and accommodates feeder 30 in loader 50, and controls loader moving mechanism 51 so that loader moving mechanism 51 moves to the position ahead of feeder base 40 of component mounter 20 which is a replenishment target. Subsequently, loader control device 57 controls feeder transfer mechanism 53 so that feeder 30 is attached to feeder base 40.

Figure 4:
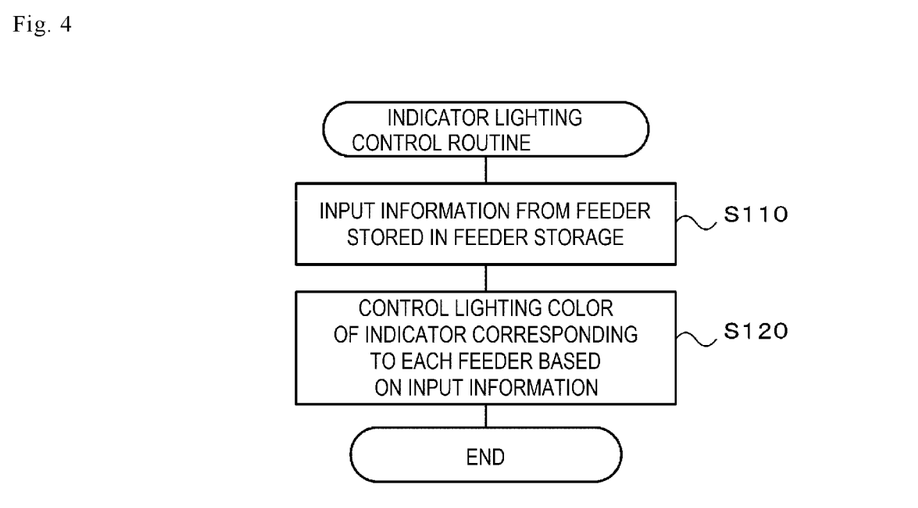
FIG. 4 is a flowchart illustrating an example of an indicator lighting control routine.

Next, an indicator lighting control routine executed by management computer 80 will be described. FIG. 4 is a flowchart illustrating an example of an indicator lighting control routine. CPU 80a of management computer 80 executes the indicator lighting control routine for each predetermined timing (for example, every several seconds). When the indicator lighting control routine starts, first, CPU 80a inputs information from feeder 30 stored in feeder storage 60 (S110). Specifically, CPU 80a inputs information on the state of feeder 30 by communicating with feeder control device 34 of feeder 30 supported by feeder base 70. Examples of the state of feeder 30 include a state in which feeder 30 does not include the component, a state in which feeder 30 is not scheduled to be used in a current production plan, a state in which feeder 30 is scheduled to be used in a current production plan, or the like. Subsequently, CPU 80a controls a lighting color of indicator 74 corresponding to each feeder 30 based on the input information (S120), and terminates the present routine. For example, when feeder 30 does not include the component, CPU 80a turns on indicator 74 corresponding to slot 72 that supports feeder 30 in red. When feeder 30 is not scheduled to be used in a current production plan, CPU 80a turns on indicator 74 corresponding to slot 72 that supports feeder 30 in yellow. When feeder 30 is scheduled to be used in a current production plan, CPU 80a turns on indicator 74 corresponding to slot 72 that supports feeder 30 in green. As a result, the operator can determine whether feeder 30 does not include the component, whether the feeder 30 is not scheduled to be used in the current production plan, or whether the feeder 30 is scheduled to be used in the current production plan by the lighting color of indicator 74.

Figure 5:
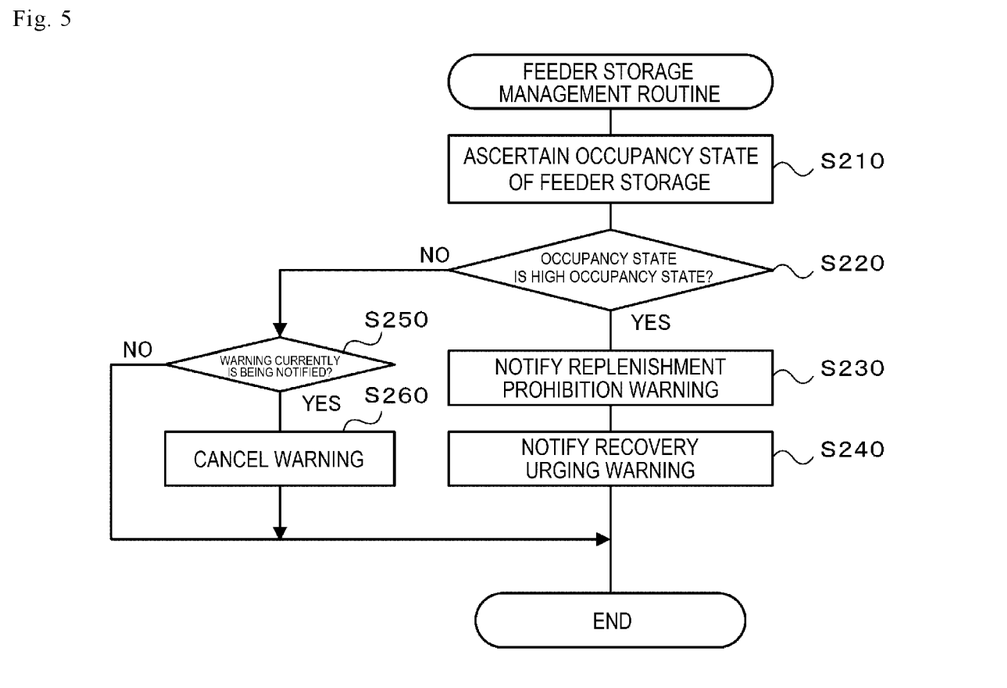
FIG. 5 is a flowchart illustrating an example of a feeder storage management routine.

Next, a feeder storage management routine executed by management computer 80 will be described. FIG. 5 is a flowchart illustrating an example of the feeder storage management routine. CPU 80a of management computer 80 executes the feeder storage management routine at each predetermined timing (for example, every several seconds). When the feeder storage management routine starts, first, CPU 80a ascertains an occupancy state of feeder 30 supported by feeder base 70 of feeder storage 60 (S210). Specifically, CPU 80a recognizes the number (occupancy number) of feeders 30 supported by feeder base 70 by communicating with feeder control device 34 of feeder 30 supported by feeder base 70 of feeder storage 60. Then, CPU 80a ascertains the occupancy state by calculating a ratio of the occupancy number of feeders 30 to the total number of slots of feeder base 70 as an occupancy ratio.

Subsequently, CPU 80a determines whether the occupancy state of feeder 30 has reached a predetermined high occupancy state (S220). Specifically, CPU 80a determines whether the occupancy state of feeder 30 has reached a predetermined high occupancy state based on whether the occupancy ratio of feeder 30 has exceeded a predetermined threshold value (for example, 70% or 80%).

When the occupancy state of feeder 30 reaches the predetermined high occupancy state in S220, CPU 80a notifies a replenishment prohibition warning (S230), further notifies a recovery urging warning (S240), and terminates the present routine. The replenishment prohibition warning is a warning for prohibiting replenishment of feeder 30 used in the next production or later to feeder base 70. The recovery urging warning is a warning to urge the operator to recover feeder 30 stored in feeder base 70. The recovery urging warning is output such that feeder 30 having a lower usage probability among feeders 30 stored in feeder base 70 has a higher recovery priority. In the recovery urging warning of the present embodiment, the warning is issued so that feeder 30 (red feeder 30) with no components corresponding to indicator 74 turned on in red is recovered with the highest priority, and when there is no red feeder 30, yellow feeder 30 not scheduled to be used in the current production plan is recovered preferentially, and when there is neither red feeder 30 nor yellow feeder 30, green feeder 30 scheduled to be used in the current production plan is recovered. That is, the warning is issued to preferentially recover feeder 30 having a low usage probability among feeders 30 stored in feeder base 70. The replenishment prohibition warning and the recovery urging warning may be output as a character string (sentence) on display 82 or may be output as a voice from a speaker (not illustrated) in order to be notified to the operator. The operator aware of the warning cancels the replenishment of feeder 30 to feeder base 70 or recovers feeder 30 from feeder base 70 in response to the warning. Alternatively, the replenishment prohibition warning or the recovery urging warning may be output as a warning signal to an automatic guided vehicle (AGV) (not illustrated). The AGV moves between feeder storage 60 and a warehouse (or shelf) that stores multiple feeders 30. In response to the warning, the control device of the AGV to which the warning signal is input cancels the replenishment of feeder 30 from the warehouse to feeder storage 60, or recovers feeder 30 from feeder storage 60 to the warehouse.

Meanwhile, when the occupancy state of feeder 30 has not reached the predetermined high occupancy state in S220, CPU 80a determines whether a warning is currently being notified (S250), cancels the warning when a warning is currently being issued (S260), and terminates the present routine. Meanwhile, when the warning is currently not being notified in S240, CPU 80a terminates the present routine as it is.

In component mounting system 10 described above, when the occupancy state of feeder 30 supported by feeder base 70 of feeder storage 60 reaches the predetermined high occupancy state, the recovery urging warning for prompting the recovery of feeder 30 supported by feeder base 70 and the replenishment prohibition warning for prohibiting the replenishment of feeder 30 used in the next production or later to feeder base 70 are output. When feeder 30 of feeder base 70 is recovered in accordance with the recovery urging warning, since the occupancy state of feeder base 70 is alleviated, after that, even when feeder 30 to be stored from component mounter 20 to feeder base 70 is generated, it is possible to receive feeder 30. In addition, when the replenishment of feeder 30 to feeder base 70 is prohibited according to the replenishment prohibition warning, since a degree of vacancy in feeder base 70 can be maintained to a certain extent, after that, even when feeder 30 to be stored from component mounter 20 to feeder storage 60 is generated, it is possible to receive feeder 30. Accordingly, it is possible to prevent feeder base 70 of feeder storage 60 from becoming in a state where there is no space.

In addition, when outputting the recovery urging warning, CPU 80a of management computer 80 outputs the recovery urging warning such that feeder 30 having a lower usage probability among feeders 30 stored in feeder base 70 has a higher recovery priority. Therefore, feeder 30 having a lower usage probability can be preferentially recovered from feeder base 70. The recovery priority of feeder 30 with no components among feeders 30 supported by feeder base 70 is set to the highest. Since feeder 30 with no components is useless, feeder 30 with no components is recovered from feeder base 70 with the highest priority.

In addition, the recovery priority is indicated by the color in indicator 74 corresponding to each of feeders 30 supported by feeder base 70. Therefore, the operator can recognize which feeder 30 should be preferentially recovered from feeder base 70 by the recovery priority (color) indicated by indicator 74.

The present disclosure is not limited in any way to the embodiment that has been described heretofore, and hence, needless to say, the present disclosure can be carried out in various aspects without departing from a technical scope of the present disclosure.

Figure 6:
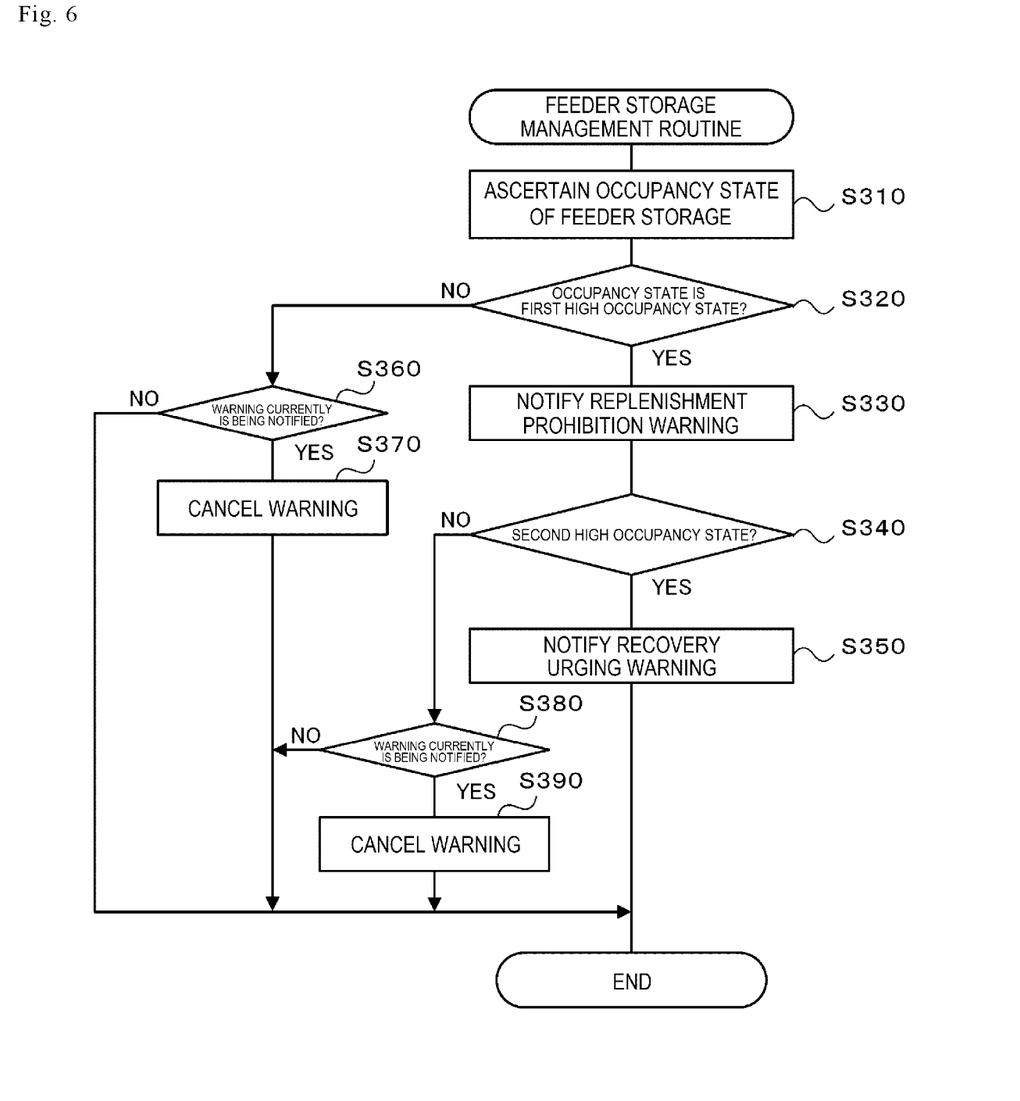
FIG. 6 is a flowchart illustrating an example of another feeder storage management routine.

For example, in the above embodiment, a determination criterion for determining whether the occupancy state of feeder 30 has reached the high occupancy state may be set higher when the recovery urging warning is output than when the replenishment prohibition warning is output. A flowchart of the feeder storage management routine at this time is illustrated in FIG. 6. When the feeder storage management routine starts, first, CPU 80a ascertains the occupancy state of feeder 30 supported by feeder base 70 of feeder storage 60 (S310). This processing is the same as S210 described above. Subsequently, CPU 80a determines whether the occupancy state of feeder 30 has reached a first high occupancy state (S320), notifies the replenishment prohibition warning when an affirmative determination is made (S330), further determines whether the occupancy state of feeder 30 has reached a second high occupancy state (S340), notifies the recovery urging warning when an affirmative determination is made (S350), and terminates the present routine. The processing in S330 and S350 is the same as that S230 and S240 described above. When a negative determination is made in S320, CPU 80a determines whether any warning is currently being notified (S360), cancels all warnings being notified when it is currently being notified (S370), and terminates the present routine. When a negative determination is made in S340, CPU 80a determines whether the recovery urging warning is currently being notified (S380), and when an affirmative determination is made, cancels the recovery urging warning (S390), and terminates the present routine. Meanwhile, when the negative determination is made in S360 or S380, CPU 80a terminates the present routine as it is. Here, the second high occupancy state is set higher than the first high occupancy state. For example, CPU 80a determines whether the occupancy state of feeder 30 has reached the first high occupancy state based on whether the occupancy ratio of feeder 30 has exceeded a first threshold value (for example, 70% or 75%), and determines whether the occupancy state of feeder 30 has reached the second high occupancy state based on whether the occupancy ratio of feeder 30 has exceeded a second threshold value (for example, 80% or 85%). As a result, since the replenishment prohibition warning is output in a state where there is relatively space in feeder base 70, the space at that time can be easily maintained, and after that, even when feeder 30 to be stored from component mounter 20 to feeder storage 60 is generated, it is easy to receive feeder 30. In addition, since feeder 30 to be stored in feeder storage 60 is received from component mounter 20 until feeder base 70 is in a state where there is not much space, the number of received feeders 30 can increase.

In the above embodiment, CPU 80a of management computer 80 outputs both the replenishment prohibition warning and the recovery urging warning when the occupancy state reaches the predetermined high occupancy state, but may output only the replenishment prohibition warning or may output only the recovery urging warning.

In the above embodiment, CPU 80a of management computer 80 determines whether the occupancy state of the feeder has reached a predetermined high occupancy state based on whether the occupancy ratio (the ratio of the occupancy number of feeders 30 to the total number of slots of feeder base 70) of feeder 30 exceeds a predetermined threshold value, but may determine by another method. For example, CPU 80a may determine based on whether the occupancy number of feeders 30 in feeder base 70 has reached a predetermined high occupancy number, or may determine based on whether a vacancy ratio (or the number of vacancies) of feeder base 70 has reached a predetermined low vacancy ratio (low vacancy number).

In the above embodiment, management computer 80 of component mounting line 12 determines whether the occupancy state of feeder 30 is in the high occupancy state, and executes control for outputting a warning when the occupancy state has reached the high occupancy state, but another computer may execute the control. As another computer, for example, a computer for managing component mounting line 12 of the entire factory may be exemplified.

In the above embodiment, the recovery priority is displayed by the color of the lamp of indicator 74, but the recovery priority is not particularly limited to this, and may be displayed by a character string (sentence). For example, the slot number of feeder 30 to be recovered with the highest priority or the slot number of feeders 30 to be preferentially recovered next may be displayed as a character string on a character string display. As such a character string display, display 82 of management computer 80 may be used, a display (not illustrated) connected to feeder base 70 may be used, or a screen of a portable device of an operator may be used.

In the above embodiment, when recovering feeder 30 supported by feeder base 70, feeder 30 is recovered by detaching feeder 30 from feeder base 70, but may be recovered together with feeder base 70. In this case, feeder storage 60 may include two or more feeder bases 70. As a result, even when one feeder base 70 is recovered, remaining feeder bases 70 can be used.

In the embodiment that has been described heretofore, indicator 74 is provided on the front surface of feeder base 70; however, instead of this configuration, an indicator similar to indicator 74 may be provided on a table of feeder storage 60 on which feeder base 70 is placed. In this case, the indicator only needs to be provided in a position lying ahead of feeder base 70 and corresponding to each slot 72.

In the embodiment that has been described heretofore, feeder storage 60 is described as being disposed at the upstream side of component mounter group 14; however, instead of or in addition to that configuration, feeder storage 60 may be disposed on a downstream side of component mounter group 14. In addition, two or more feeder storages 60 may be disposed in series on the upstream side (or the downstream side) of component mounter group 14.

In the above embodiment, a solder printer for printing solder on substrate S before component mounting may be added to component mounting line 12, or an inspector for inspecting whether a component is correctly mounted on substrate S after the component mounting may be added thereto. In addition, component mounter group 14 and feeder storage 60 may be adjacent to each other, or a solder printer or the like may be disposed between component mounter group 14 and feeder storage 60.

In the embodiment that has been described heretofore, loader 50 is described as executing the operation of exchanging feeders 30 for component mounter 20; however, the worker may execute this operation. In this case, a guidance for how to exchange feeders 30 may be caused to be displayed on touch panel display 27 of component mounter 20 or display 82 of management computer 80, and thus, the worker can exchange feeders 30 in accordance with the guidance so displayed.

In the above embodiment that has been described heretofore, feeder 30 is exemplified as the component supply device, but the present disclosure is not particularly limited thereto, and hence, for example, a tray on which multiple components are placed may be adopted as the component supply device.

The component mounting system of the present disclosure may be configured as below.

In the component mounting system of the present disclosure, when the control section outputs the recovery urging warning, the control section may output the recovery urging warning such that the component supply device having a lower usage probability among the component supply devices supported by the storage area has a higher recovery priority. As a result, it is possible to preferentially recover the component supply device having a lower usage probability from the storage area.

In the component mounting system of the present disclosure, the recovery priority may be set to be highest in the component supply device with no components among the component supply devices supported by the storage area. Since the component supply device with no components is useless, the component supply device with no components is recovered from the storage area with the highest priority. It should be noted that the recovery priority may be set so that a component supply device that is not scheduled to be used in the next production or later is placed at the next point.

In the component mounting system of the present disclosure, the recovery priority may be indicated on a display corresponding to each of the component supply devices supported by the storage area. As a result, it is possible to recognize which component supply device should be preferentially recovered from the storage area based on the recovery priority indicated on the display.

In the component mounting system of the present disclosure, the control section may output both the recovery urging warning and the replenishment prohibition warning, and a determination criterion for determining whether the occupancy state of the component supply device has reached the high occupancy state may be set higher when the recovery urging warning is output than when the replenishment prohibition warning is output. As a result, since the replenishment prohibition warning is output in a state where there is relatively space in the storage area, the space at that time can be easily maintained, and after that, even when the component supply device to be stored from the component mounter to the storage is generated, it is easy to receive the component supply device. In addition, since the component supply device to be stored from the component mounter to the storage is received until the storage area is in a state where there is not much space, the number of received component supply devices can increase.

INDUSTRIAL APPLICABILITY

The present disclosure can be applied to a technical field in which a component is mounted on a mounting target using a component mounter group.

REFERENCE SIGNS LIST

10: component mounting system, 12: component mounting line, 14: component mounter group, 18: X-axis rail, 20: component mounter, 20A: supply area, 20B: stock area, 21: substrate conveyance device, 22: head, 23: head moving mechanism, 27: touch panel display, 28: mounting control device, 30: feeder, 32: tape reel, 33: tape feeding mechanism, 34: feeder control device, 40: feeder base, 42: slot, 45: connector, 50: loader, 50A: upper transfer area, 50B: lower transfer area, 51: loader moving mechanism, 53: feeder transfer mechanism, 55: encoder, 57: loader control device, 60: feeder storage, 70: feeder base, 72: slot, 74: indicator, 75: connector, 80: management computer, 80$a$: CPU, 80$b$: ROM, 80$c$: RAM, 80$d$: HDD, 82: display, 84: input device

The invention claimed is:

1. A component mounting system comprising:
   a component mounter group in which multiple component mounters in which multiple component supply devices are detachably set and configured to mount a component supplied by the component supply device on a mounting target are arranged along a conveyance direction of the mounting target;

a storage provided on an upstream side or a downstream side of the component mounter group and having a storage area in which the multiple component supply devices are arranged and supported detachably;

a loader configured to move along the conveyance direction and automatically take out and/or attach the component supply devices from and to the component mounter and the storage; and a control section configured to output at least one of a recovery urging warning for prompting recovery of the component supply devices supported by the storage area and a replenishment prohibition warning for prohibiting replenishment of the component supply device used in a next production or later onto the storage area, when an occupancy state of the component supply devices supported by the storage area reaches a predetermined high occupancy state.

2. The component mounting system according to claim 1, wherein when the control section outputs the recovery urging warning, the control section outputs the recovery urging warning such that the component supply device having a lower usage probability among the component supply devices supported by the storage area has a higher recovery priority.

3. The component mounting system according to claim 2, wherein the recovery priority is set to be highest in the component supply device with no components among the component supply devices supported by the storage area.

4. The component mounting system according to claim 2, wherein the recovery priority is indicated on a display corresponding to each of the component supply devices supported by the storage area.

5. The component mounting system according to claim 1, wherein the control section outputs both the recovery urging warning and the replenishment prohibition warning, and a determination criterion for determining whether the occupancy state of the component supply device has reached the high occupancy state is set higher when the recovery urging warning is output than when the replenishment prohibition warning is output.

* * * * *